United States Patent [19]

Ostop et al.

[11] 4,264,383
[45] Apr. 28, 1981

[54] TECHNIQUE FOR MAKING ASYMMETRIC THYRISTORS

[75] Inventors: John A. Ostop, Jeannette; Robert W. Marks, Mt. Pleasant, both of Pa.

[73] Assignee: Westinghouse Electric Corp., Pittsburgh, Pa.

[21] Appl. No.: 69,195

[22] Filed: Aug. 23, 1979

[51] Int. Cl.³ .......................................... H01L 21/225
[52] U.S. Cl. .................................. 148/188; 148/189; 148/190
[58] Field of Search ...................... 148/188, 189, 19 D

[56] References Cited

U.S. PATENT DOCUMENTS

| 2,873,222 | 2/1959 | Derick et al. | 148/190 X |
| 3,362,858 | 1/1968 | Knopp | 148/189 X |
| 3,445,302 | 5/1969 | Lepiane | 148/190 X |
| 3,573,116 | 3/1971 | Cohen | 148/188 X |
| 3,649,387 | 3/1972 | Frentz et al. | 148/188 X |
| 3,870,576 | 3/1975 | Isitorsky et al. | 148/190 X |
| 4,038,111 | 7/1977 | Dumas | 148/190 X |

Primary Examiner—G. Ozaki
Attorney, Agent, or Firm—C. L. Menzemer

[57] ABSTRACT

A method for doping a wafer of n-type seimiconductor material having two surfaces includes the steps of applying a boron solution to a first surface of the wafer and heating the wafer to drive the boron into the semiconductor wafer for forming a first p-type region. Both surfaces of the wafer are then exposed to a gallium vapor for forming a second p-type region on the second surface and deepening the extent of the first p-type region.

2 Claims, 8 Drawing Figures

TECHNIQUE FOR MAKING ASYMMETRIC THYRISTORS

BACKGROUND OF THE INVENTION

1. Field of the Invention

The present invention relates to methods for doping semiconductor devices, and, in particular to methods for doping semiconductor thyristors.

2. Description of the Prior Art

The present process flow for making an asymmetric gallium thyristor requires at least two separate diffusion furnace operations. A closed-tube gallium deposition is followed by a spin-on boron and oxidation-drive step.

In the closed-tube step, the first step, a quantity of elemental gallium is enclosed in a tube along with a wafer of n-type semiconductor material and the tube is sealed. The tube is sealed so that the release of gallium vapor from the elemental gallium upon heating can be controlled. That is, the quantity of elemental gallium enclosed in the sealed tube is determined such that the quantity of vapor produced when the element gallium is heated is controlled, typically, to just fill the sealed tube. The sealed tube is then broken open and the doped wafer is removed. A high-concentration n+-type layer is created by spinning on boron and driving it in by heating, ordinarily at about 1250° C.

SUMMARY OF THE INVENTION

A method for doping a wafer of n-type semiconductor material comprises, broadly, the steps of applying a solution of boron to a first face of the wafer for creating a first p-type region therein and then exposing the wafer to a quantity of gallium vapor for forming a second p-type region in a second face and deepening the extent of first p-type region. Additional steps for making a thyristor, for example, include the steps of oxidizing the wafer, etching the resulting oxide layer, and diffusing a n-type dopant in the second p-type region.

More specifically, the boron may be applied to the first face of the semiconductor wafer either by spraying or by applying a droplet of solution. The wafer is then spun around at a rate of revolution sufficient to remove excess boron solution and then it is heated in a first section of a quartz tube to drive in the boron in the solution in order to form the first p-type region. In another section of the quartz tube, a quantity of gallium oxide is heated and then exposed to a quantity of carbon monoxide (CO) gas, reducing the gallium oxide to elemental gallium and carbon dioxide ($CO_2$). The elemental gallium begins to vaporize and the two surfaces of the wafer are exposed to the gallium vapor creating the second p-type region in the second face and deepening the first p-type region in the first face.

DESCRIPTION OF THE PREFERRED EMBODIMENT

Figure 1:
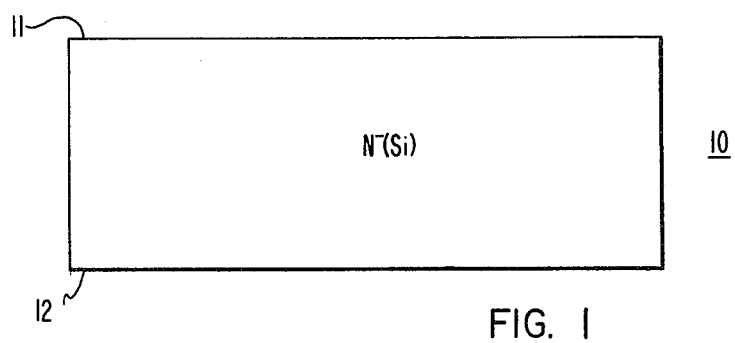
FIGS. 1, 3, 5, 7, and 8 show a thyristor in progressive steps according to the method of the present invention.
Figure 3:
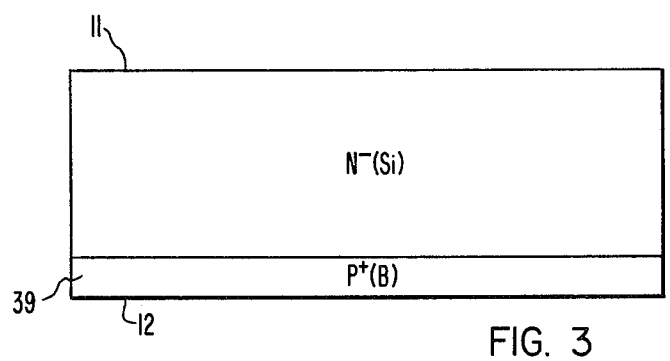
Figure 2:
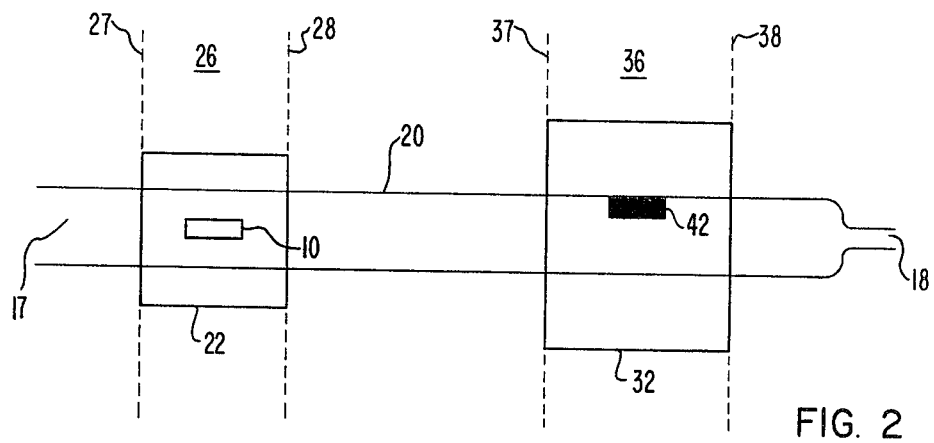
FIGS. 2, 4, and 6 show apparatus appropriate for effecting the method of the present invention.

According to the method of the present invention, a disc-shaped wafer 10 of n-type semiconductor material, preferably silicon, has a first (bottom) face or surface 12 and a second (top) face or surface 11, as shown in cross-section in FIG. 1. A solution containing boron is generously applied to the bottom face 12 at room temperature so as to assure that the entire face 12 is covered with the boron solution. The solution may be applied by spraying the bottom face 12 with, for example, a paint spray gun or by depositing a droplet of the boron solution from a squeeze bottle or eye dropper. The boron solution is preferably $B_2O_3$ in water but may be any other solution containing boron so long as the solvent must contain no metals and no other n-type or p-type dopant and boron must be completely soluble in the solvent so as to minimize or eliminate any particles in the solvent. After the boron solution is applied, any excess solution should be removed, for example, by spinning the wafer 10 at a rate of approximately 2000 to 3000 revolutions per minute (rpm). As shown in FIG. 2, an open quartz tube 20 has been inserted through furnaces 22 and 32 such that one section 26 of the tube 20 between the dashed lines at 27 and 28 is heated by the furnace 22 and another section 36 of the tube 20 between the lines 37 and 38 is heated by the furnace 32. After the spinning operation, the wafer 10 is inserted into the tube 20 via the opening 17 and into the section 26 heated by the furnace 22. The furnace 22 heats the wafer 10 to a temperature of between approximately 1000° C. to 1250° C. for driving the boron in the boron solution into the bottom face 12 and forming a p-type layer 39 as shown in FIG. 3. The temperature of the furnace 22 may be greater than 1250° C. or less than 1000° C. so long as it is high enough to cause the boron to drive into the bottom face 12 but not so high as to melt the wafer 10. Generally, however, the temperature of the furnace 22 is as high as possible in order that the boron be driven into the bottom face 12 as fast as possible. Boron is a preferred element for creating the p-type region 39 because of its high solubility in silicon. Such a high solubility provides an impurity concentration of on the order of $10^{20}$ donor atoms/$cm^3$ resulting in a lower contact impedance with any subsequent metallization. A lower contact impedance causes a lower voltage drop across the finished device in the ON state or condition. Any other element can be used, however, so long as it will diffuse or drive into the wafer 10 at a temperature below the melting point of the semiconductor material used and so long as it can provide a p-type layer 39 having a high impurity concentration on the order of $10^{20}$ donor atoms/$cm^3$.

Figure 5:
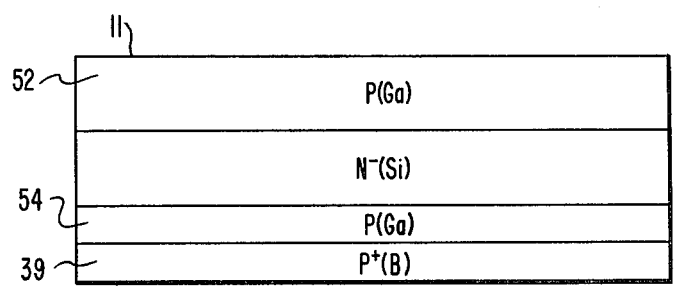
Figure 4:
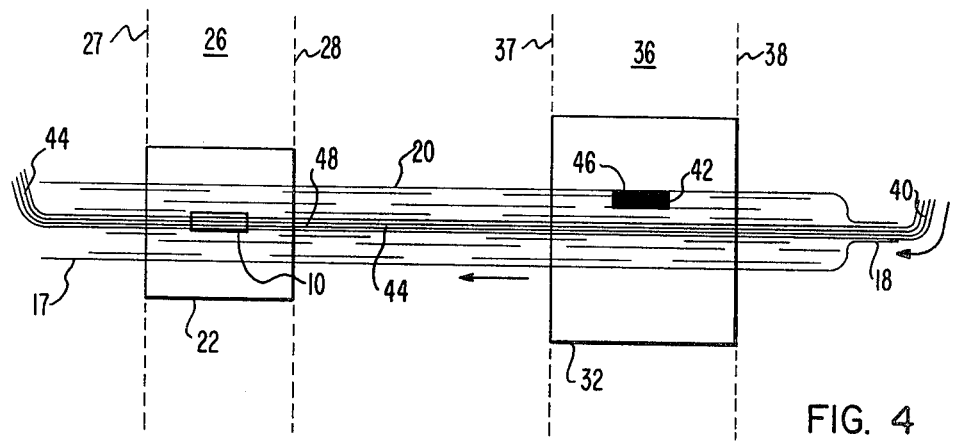

A quantity 40 of gallium oxide placed in the section 36 of the quartz tube 20 is heated by the furnace 32 to a temperature of between approximately 800° C. to 1000° C. When a quantity 40 of carbon monoxide (CO) gas is passed over the gallium oxide 42 via the opening 18 in the quartz tube 20 as shown in FIG. 4, a reduction action occurs producing a quantity 44 of carbon dioxide gas and leaving a quantity 46 of elemental gallium. At the temperature of the furnace 32 (800° C.–1000° C.), the elemental gallium begins to vaporize producing a gallium gas 48. The wafer 10 is exposed to the gallium vapors or gas 48 producing a p-type layer 52 in the top face 11 as shown in FIG. 5. Moreover, the gallium gas diffuses through the boron p-type layer 39 and causes a deeper supplemental gallium p-type layer 54. If the temperature of the furnace 32 is much higher than 1000° C., then the gallium oxide 42 will violently react to the CO gas 40 and metallic gallium will be deposited on the wafer 10 causing a degrading of semiconductor performance. Therefore, the temperature of the furnace 32 should not be so high as to cause elemental gallium to be deposited on the wafer 10 when the gallium oxide is 42 exposed to the CO gas 40, but, the temperature of the furnace 32 should be at least high enough to cause the gallium oxide 42 to vaporize when exposed to the CO.

Figure 6:
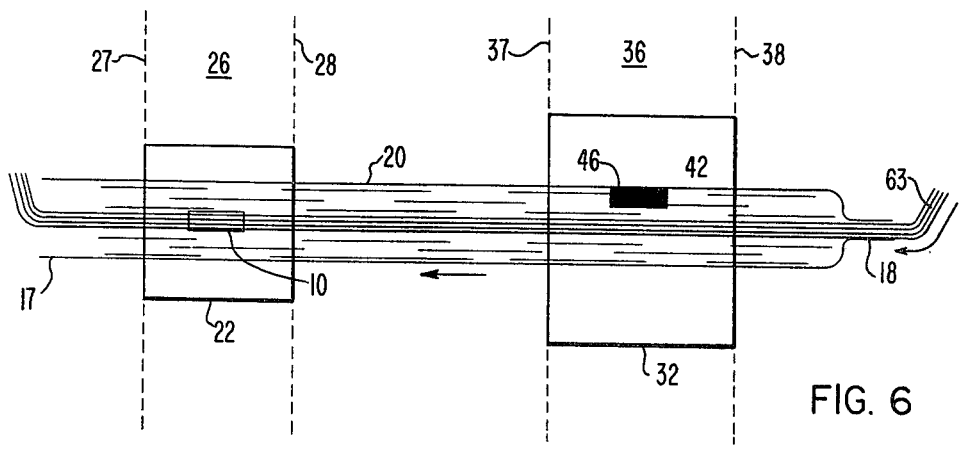
Figure 7:
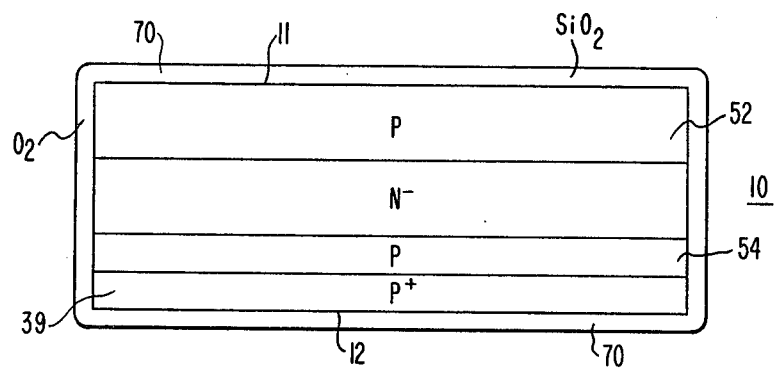
Figure 8:
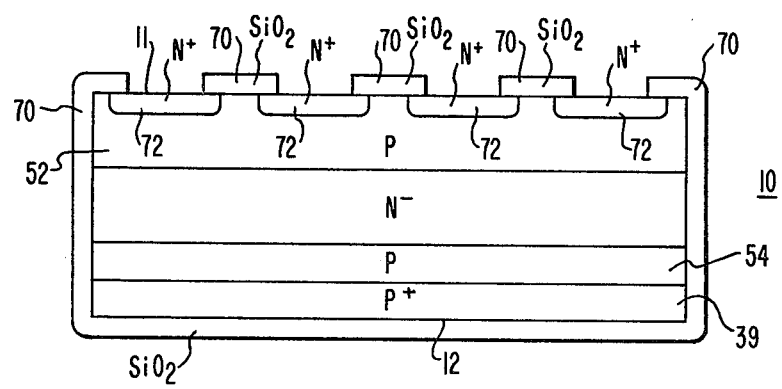

The tube 20 is purged of the gallium gas 48 and then the wafer 10 is exposed to a quantity 63 of an oxygen mixture as shown in FIG. 6 and a layer 70 of oxide is formed over the surfaces of the wafer 10 as shown in FIG. 7. By any well-known, conventional method, for example, photolithography, a pattern is etched in the oxide layer 70 and phosphorus is diffused for creating a p-type emitter layer 72 as shown in FIG. 8. The oxide layer is then removed and the faces 11 and 12 are metallized.

The method of the present invention detailed above is ideally suited to low-cost, lower-voltage thyristors, but is adaptable to higher voltage designs by performing a conventional aluminum diffusion step before the first step of the method of the present invention, that is before applying the boron solution to the bottom face 12.

While the invention has been described in its preferred embodiment, it is to be understood that the words which have been used herein are words of description not words of limitation, and that changes may be made within the purview of the appended claims without departing from the true scope and spirit of the invention in its broader aspects.

It will be appreciated by those skilled in the art that the method of the present invention may be carried out in various ways and may take various forms and embodiments other than the illustrative embodiments heretofore described. For example, the essential steps of the present invention are applying a solution of boron to the bottom surface 12 for forming the n-type layer 31 and then exposing the surfaces 11 and 12 to the quantity of gallium vapor or gas 48 for forming the p-type layers 52 and 54. All other steps describe only a preferred embodiment of practicing the method of the present invention and not the only embodiment.

Since still other procedural variations are possible, it is to be understood that the scope of the invention is not limited by the details of the foregoing description but will be defined in the following claims.

What we claim is:

1. A method for doping a wafer of n-type semiconductor material, said method comprising the steps of:
    (a) applying a solution of boron to a first surface of said wafer of semiconductor material;
    (b) heating said wafer of semiconductor material to a first temperature for diffusing said boron into the whole of said first surface;
    (c) heating a quantity of gallium compound to a second temperature, said second temperature less than said first temperature;
    (d) exposing said quantity of gallium alloy to a quantity of chemical gas for reducing said quantity of gallium compound thereby producing a quantity of gallium vapor; and
    (e) exposing said wafer of semiconductor material to said quantity of gallium vapor for diffusing said gallium into the whole of said first and second surfaces.

2. A method for doping in a quartz tube a wafer of n-type silicon material, said quartz tube having first and second sections, said wafer of silicon material having first and second surfaces, said method comprising the steps of:
    (a) applying a drop of a boron solution to said first surface of said wafer of silicon material;
    (b) spinning said wafer of silicon material at a rate of 3000 revolutions per minute for eliminating excess boron solution from said first surface;
    (c) heating said wafer of silicon material to a temperature of 1250° C. in the first section of said quartz tube diffusing said boron into the first surface of said wafer for creating a p-type region in said first surface, said quartz tube having a quantity of gallium oxide in said second section;
    (d) heating said quantity of gallium oxide to a temperature of 1000° C.;
    (e) exposing said quantity of gallium oxide to a quantity of carbon monoxide (CO) gas for reducing said gallium oxide and thereby producing a quantity of gallium vapor in said quartz tube;
    (f) exposing said first and second surfaces of said wafer of silicon material to said quantity of gallium vapor for creating a p-type region also on said second surface of said wafer of silicon material;
    (g) purging said quantity of gallium vapor from said quartz tube and exposing said wafer of silicon material to a quantity of oxygen for forming a layer of oxide material on said wafer of silicon material;
    (h) etching a pattern in said layer of oxide material on said second surface of said wafer of silicon material; and
    (i) exposing said wafer of silicon material to a quantity of phosphorus for producing a n-type region in the p-type region on said second surface.

* * * * *